(12) United States Patent
Ookawa

(10) Patent No.: US 7,193,430 B2
(45) Date of Patent: Mar. 20, 2007

(54) SEMICONDUCTOR INTEGRATED CIRCUIT DEVICE WITH FILTER CIRCUIT

(75) Inventor: Kouichi Ookawa, Isehara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 10/865,923

(22) Filed: Jun. 14, 2004

(65) Prior Publication Data
US 2005/0088224 A1  Apr. 28, 2005

(30) Foreign Application Priority Data
Oct. 23, 2003  (JP) ............................. 2003-363461

(51) Int. Cl.
*H03K 17/16* (2006.01)
*H03K 19/003* (2006.01)

(52) U.S. Cl. ............................. 326/26; 326/24; 326/27; 326/98

(58) Field of Classification Search ............ 326/26–27, 326/21–24, 93–98, 29
See application file for complete search history.

(56) References Cited

U.S. PATENT DOCUMENTS 5,910,730 A * 6/1999 Sigal .......................... 326/24
6,044,017 A * 3/2000 Lee et al. ................ 365/185.18
6,366,115 B1 * 4/2002 DiTommaso ................ 326/32
6,590,421 B2 * 7/2003 Chung et al. ................ 326/83
6,750,677 B2 * 6/2004 Sumita ........................ 326/94
6,803,792 B2 * 10/2004 Yasuda et al. ................ 326/93
6,860,578 B2 * 3/2005 Yamada et al. ............... 347/19
6,882,171 B2 * 4/2005 Ong ........................... 324/765

FOREIGN PATENT DOCUMENTS

JP          08-070242        3/1996

* cited by examiner

*Primary Examiner*—Rexford Barnie
*Assistant Examiner*—Jason Crawford
(74) *Attorney, Agent, or Firm*—Oblon, Spivak, McClelland, Maier & Neustadt, P.C.

(57) ABSTRACT

There is provided a semiconductor integrated circuit device with a filer circuit serving for eliminating a glitch contained in a logic signal supplied to the device, wherein the filter circuit includes: a first delay circuit activated within a certain period after each rising edge timing of input logic signals to delay the rising edge; a second delay circuit activated within a certain period after each falling edge timing of the input logic signals to delay the falling edge; and an output driver controlled by outputs of the first and second delay circuits to output delayed logic signals to an output node in response to the input logic signals.

13 Claims, 10 Drawing Sheets

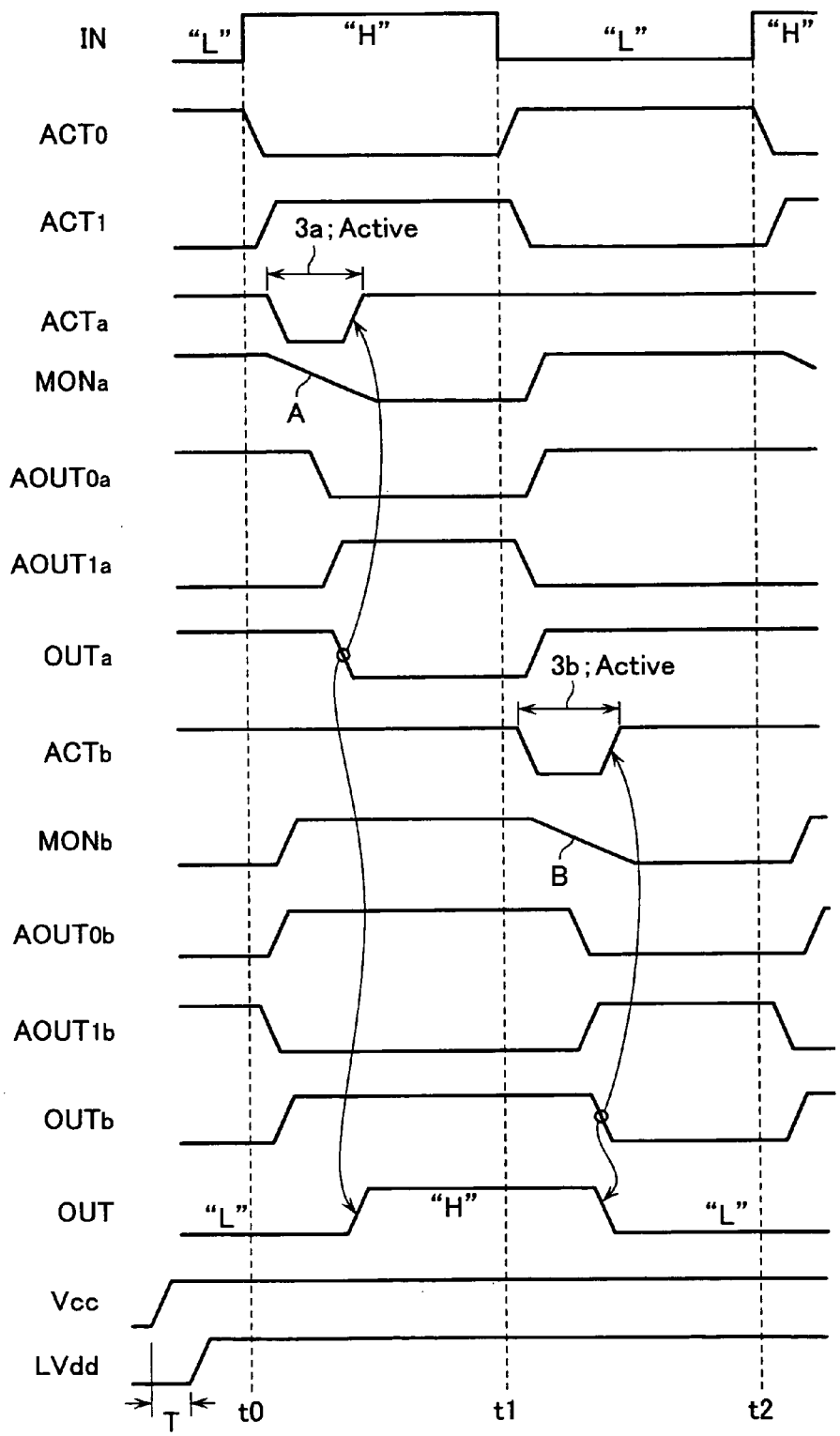

SEMICONDUCTOR INTEGRATED CIRCUIT DEVICE WITH FILTER CIRCUIT

CROSS-REFERENCE TO RELATED APPLICATION

This application is based on and claims the benefit of priority from the prior Japanese Patent Application No. 2003-363461, filed on Oct. 23, 2003, the entire contents of which are incorporated herein by reference.

BACKGROUND OF THE INVENTION

1. Field of the Invention

This invention relates to a semiconductor integrated circuit device with a filter circuit for eliminating a glitch contained in a logic signal.

2. Description of Related Art

It is frequently required of a semiconductor integrated circuit device to eliminate or suppress glitches contained in logic signals to be transferred to internal circuits thereof. A glitch is defined as a transitional voltage spike noise with a narrow pulse width. Therefore, to remove glitches, a filter circuit is used in general. Such the glitch-eliminating filter circuit is usually formed by use of an integral circuit (for example, refer to Japanese Patent Application Laid Open No. 7-336201).

FIG. 5 shows a configuration of a conventional filter circuit 30. This circuit 30 includes two systems of delay circuits 31a and 31b, and an output driver 32 with PMOS transistor P11 and NMOS transistor N11 alternately driven by outputs the delay circuits 31a and 31b. The delay circuit 31a has an inverter chain with inverters I31a, I32a and I33a connected in series to an input node IN, and an integral circuit 32a disposed between the inverters I31a and I32a, which is formed of resistor R11a and capacitor C1a. Similarly, the delay circuit 31b has an inverter chain with inverters I31b, I32b and I33b connected in series to the input node IN, and an integral circuit 32b disposed between the inverters I32b and I33b, which is formed of resistor R11b and capacitor C1b.

The integral circuits 32a and 32b disposed in the respective delay circuits 31a and 31b serve as low-pass filters (LPF) for eliminating glitches superimposed on input logic signals to be transferred to the internal circuits. In detail, input to the input node IN with level transitions from "L" to "H", and from "H" to "L", the logic signals are delayed with certain delay times via the delay circuits 31a and 31b to turn on one of the PMOS transistor P11 and NMOS transistor N11 and turn off the other, whereby delayed logic signals are output at the output node OUT. Positive and negative glitch pulses contained in the input logic signals may be eliminated by the integral circuit 32a and 32b in the delay circuits 31a and 31b.

However, the conventional glitch eliminating filter circuit, which is formed of a combination of inverters and integral circuit as described above, has such undesirable properties as being not only dependent on power supply voltage variation, but also influenced by threshold voltage variation of transistors in the inverters.

SUMMARY OF THE INVENTION

According to an aspect of the present invention, there is provided a semiconductor integrated circuit device with a filer circuit serving for eliminating a glitch contained in a logic signal supplied to the device, wherein the filter circuit includes:

a first delay circuit activated within a certain period after each rising edge timing of input logic signals to delay the rising edge;

a second delay circuit activated within a certain period after each falling edge timing of the input logic signals to delay the falling edge; and an output driver controlled by outputs of the first and second delay circuits to output delayed logic signals to an output node in response to the input logic signals.

BRIEF DESCRIPTION OF THE DRAWINGS

FIG. 4 shows waveforms of the filter circuit shown in FIG. 1.

DETAILED DESCRIPTION OF THE EMBODIMENTS

Illustrative embodiments of this invention will be explained with reference to the accompanying drawings below.

[Embodiment 1]

Figure 1:
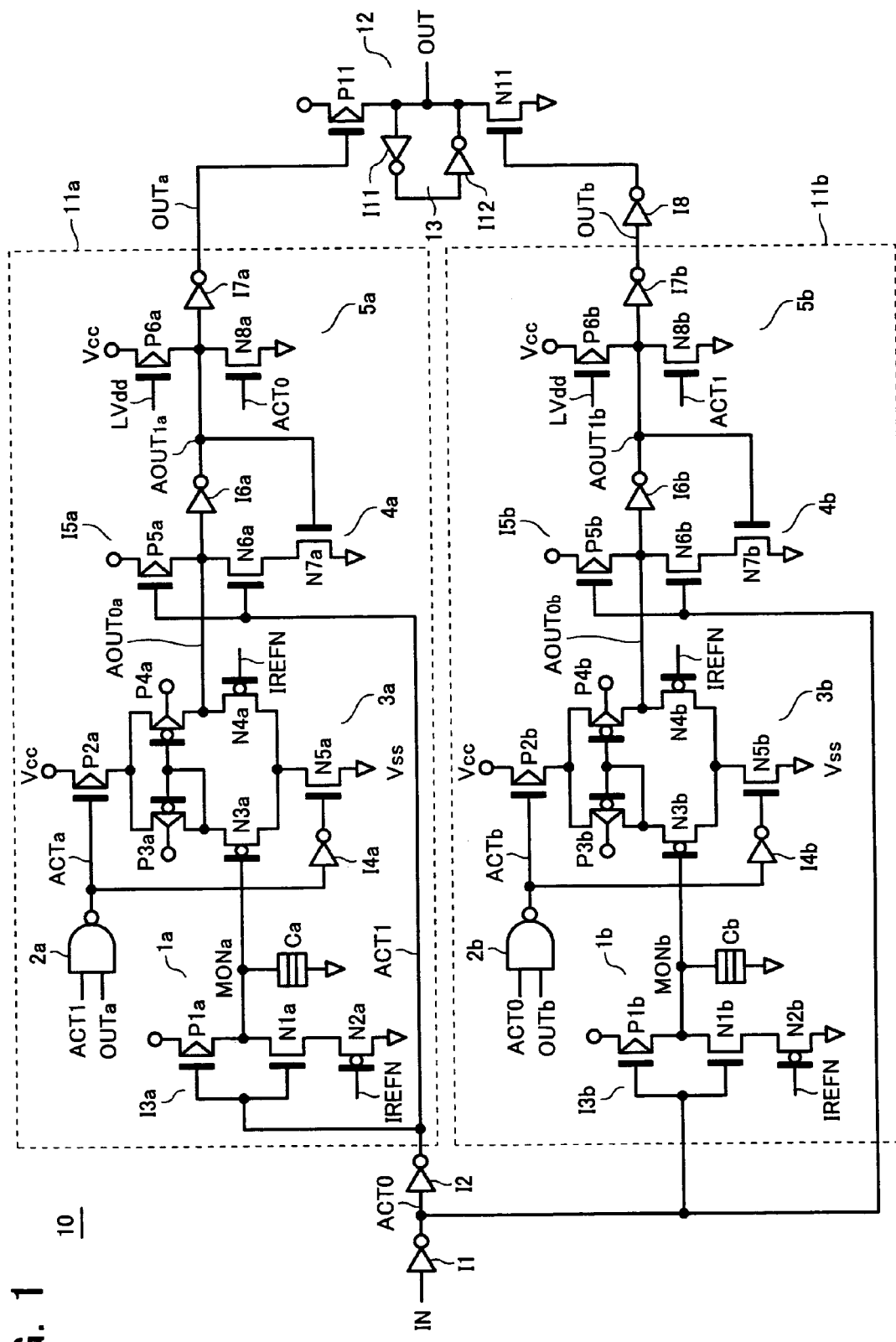
FIG. 1 shows a configuration of a filter circuit in accordance with an embodiment of the present invention.

FIG. 1 shows a configuration of a filter circuit 10 formed in a semiconductor integrated circuit device in accordance with an embodiment of the present invention. The filter circuit 10 is one disposed at an input node of the integrated circuit device for eliminating a glitch contained in a signal supplied to the device. The filter circuit 10 has two delay circuits 11a and 11b, and an output driver 12 driven by outputs of the delay circuits 11a and 11b. Since two delay circuits 11a and 11b have the same configuration, the same reference symbols are used for the respective circuit components in these delay circuits 11a and 11b except that those are distinguished from each other by adding suffixes "a" and "b".

The first delay circuit 11a is configured to be activated in a certain period after each "rising edge" timing of input logic signals supplied to an input node IN so as to delay the rising edge (i.e., rising phase), thereby on-driving PMOS transistor P11 of the output driver 12. Glitch removing is done in the delay processing of this circuit. During the input node IN is held at an "H" level, the second delay circuit 11b will be held in an inactive state.

The second delay circuit 11b is configured to be activated in a certain period after each "falling edge" timing of input logic signals supplied to the input node IN so as to delay the falling edge (i.e., falling phase), thereby on-driving the NMOS transistor N11 of the output driver 12. Glitch removing is done in the phase-delay processing of this circuit. During the input node IN is held at an "L" level, the first delay circuit 11a will be held in an inactive state.

To make two delay circuits 11a and 11b complementarily operable in response to the input logic pulse signals, two stages of inverters I1 and I2 are connected in series to the input node IN. Generated at the respective outputs ACT0 and ACT1 of these inverters I1 and I2 are two species of signals (i.e., one set of signals) with complementary levels in response to the input logic signals. These two species of signals are input to the first and second delay circuits 11a and 11b, respectively.

Hereinafter, referring to the first delay circuit 11a, the circuit configuration will be explained in detail. A first inverter I3a has an input connected to the node ACT1. Disposed between an NMOS transistor N1a of the inverter I3a and a ground potential node Vss is a current source NMOS transistor N2a, which is driven by a reference voltage IREFN. This reference voltage IREFN is lower than and not dependent on the power supply voltage Vcc. The current source NMOS transistor N2a is formed of an intrinsic (I)-type of NMOS transistor into which no channel-doping has been done. A capacitor Ca is coupled to output MONa of the inverter I3a. This capacitor Ca is, for example, a MOS capacitor formed of a D-type of MOS transistor.

The inverter I3a and capacitor Ca constitute a low-pass filter (LPF) 1a serving for glitch-eliminating. In detail, the level transition edge from "H" to "L" of the waveform at node MONa (i.e., falling edge) is delayed due to a CR time constant defined by on-resistance (R) of the current source MNOS transistor N2a and capacitance (C) of the capacitor Ca. Suitably designing this CR time constant, it becomes possible to eliminate or suppress glitches with a pulse width lower than a certain value.

Connected to the output MONa of the inverter I3a is a current-mirror type of differential amplifier 3a. The differential amplifier 3a has a pair of driver NMOS transistors N3a and N4a and a pair of PMOS transistors P3a and P4a constituting a current-mirror load, drains of which are coupled to the drains of NMOS transistors N3a and N4a, respectively. One gate (i.e., gate of N3a) of the differential NMOS transistors N3a and N4a is connected to the node MONa, and the other gate (i.e., gate of N4a) is driven by a reference voltage IREFN that is independent of the power supply voltage Vcc. These PMOS transistors P3a, P4a and NMOS transistors N3a, N4a are also formed of I-type transistors.

Disposed between a common source of PMOS transistors P3a, P4a of the differential amplifiers 3a and the power supply node Vcc is an activating PMOS transistor P2a, and disposed between a common source of NMOS transistors N3a, N4a and the ground potential node Vss is an activating MMOS transistor N5a. To turn on these activating transistors P2a and N5a in a certain period, a NAND gate 2a is prepared.

Connected to two inputs of this NAND gate 2a are input ACT1 and output OUTa of the delay circuit 11a. Therefore, during both of node ACT1 and OUTa are in a "H" level state (i.e., until the node OUTa becomes "L" with a certain delay time after the node ACT1 has become "H"), output ACTa of the NAND gate 2a becomes "L". In response to this "L" level of output ACTa, the activating transistors P2a and N5a become on, whereby the differential amplifier 3a is activated.

The output AOUT0a of the differential amplifier 3a is connected to a node AOUT1a via an inverter I6a, and the node AOUT1a is further connected to a delay output node OUTa via an inverter I7a. Further connected to the output AOUT0a is output of another inverter I5a which is driven by a voltage of the node ACT1. Serially connected to the NMOS transistor N6a of the inverter I5a is an MNOS transistor N7a, the gate of which is driven by a voltage of node AOUT1a.

Therefore, the inverters I5a and U6a are connected in parallel with reversed polarities with each other to constitute a latch circuit 4a, which is controlled by a latch signal generated at the node ACT1. The node ACT1 becoming "H", NMOS transistors N6a and N7a becomes on to set the output AOUT0a of the differential amplifier 3a at a "L" level state. The differential amplifier 3a is active during the node ACTa is in a "L" state, but otherwise inactive. However, after having disabled the differential amplifier 3a, the latch circuit 4a serves for statically holding the output AOUT0a at the "L" level state during the node ACT1 is in the "H" state in response to ACT1="H" and AOUT1a="H".

The output driver 12 has PMOS transistor P11 and NMOS transistor N11, sources of which are coupled to the power supply node Vcc and ground potential node Vss, respectively, and drains of which are commonly connected to an output node OUT. The delay output OUTa of the first delay circuit 11a is connected to the gate of PMOS transistor P11, and delay output OUTb of the second delay circuit 11b to the gate of NMOS transistor N11 via an inverter I8. The output node OUT of this output driver 12 serves as a filter output node. As described in detail later, generated at this output node OUT are output logic pulse signals delayed by a certain period corresponding to the input logic pulse signals supplied to the input node IN, glitch noises contained in which have been eliminated or suppressed.

Disposed at the interconnection node AOUT1a between inverters I6a and I7a is a PMOS transistor P6a for precharging the node AOUT1a at a power-on time. That is, PMOS transistor P6a is gate-driven by an internal power supply voltage LVdd which rises-up behind the power supply voltage Vcc, thereby becoming on within a certain period after power-on. Further disposed at the interconnection node AOUT1a is a pull-down NMOS transistor N8a which is driven by a voltage of the node ACT0. These PMOS transistor P6a and NMOS transistor N8a constitute an initial setup circuit 5a which serves for initially setting the node AOUT1a (thereby setting the output node OUTa) at a certain voltage level at a power-on time.

In detail, if node ACT0 is "L" at a power-on time, node AOUT1a is charged-up via the PMOS transistor P6a to become "H", and the output node OUTa becomes "L". If node ACT0 is "H", node AOUT1a is discharged by the NMOS transistor N8a to become "L".

In the second delay circuit 11b, an initial setup circuit 5b is connected to an interconnection node AOUT1b with a precharging PMOS transistor P6b and a pull-down NMOS transistor N8b driven by a voltage of node ACT1 as well as the first delay circuit 11a. Therefore, the output node OUTb becomes "L" or "H" in accordance with a level of "L" or "H" at the node ACT1.

As a result, the output driver 12 is initialized to generate an output voltage level in response to the input logic signal level at the beginning of power-on before delayed outputs are generated from the delay circuits 11a, 11b. In detail, input node IN being "H", PMOS transistor P11 is on, and NMOS transistor N11 off, whereby the output node OUT becomes "H". Contrary to this, input node being "L", the output node OUT becomes "L".

At the filter output node OUT, two stages of inverters I11 and 112 constituting a ring are connected to constitute a feed-back circuit 13 for performing positive feed-back control of the voltage of the output node OUT. The delay output nodes OUTa and OUTb of the first and second delay circuits 11a and 11b basically change to be in complementary levels in such a way that while one is "H", the other is "L". However, there is a time period in that both of the nodes OUTa and OUTb are "H". In this period, the output node OUT becomes to be in a floating state with high-output impedance (HiZ). The feed-back circuit 13 serves for statically keeping a voltage level of the floating output node OUT.

The second delay circuit 11b is made substantially the same as the first delay circuit 11a except that output ACT0 of the inverter I1 is input to the second delay circuit 11b as described above. In other words, input signals of the second delay circuit 11b are inverted in logic in contrast with the first delay circuit 11a. Therefore, detailed explanations for the second delay circuit 11b will be omitted.

Figure 2:
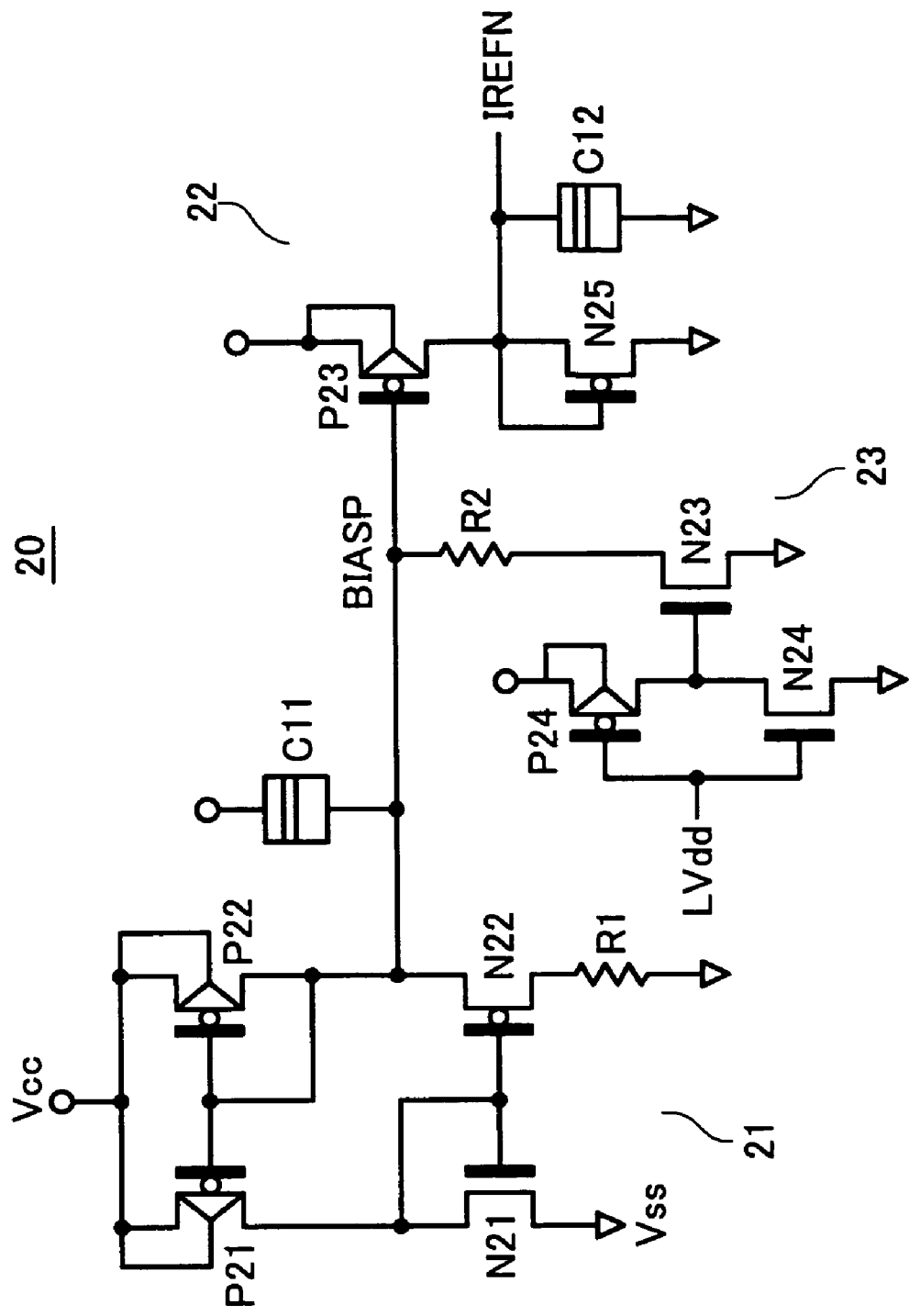
FIG. 2 shows a reference voltage generation circuit used in the filter circuit.

The reference voltage IREFN applied to the inverters I3a, I3b and differential amplifiers 3a, 3b shown in FIG. 1 is generated from a well-known reference voltage generation circuit 20 as shown in FIG. 2. This reference voltage generation circuit 20 has a reference current source circuit 21 with a Wilson-type current-mirror circuit. PMOS transistor P23 driven by the output BIASP of the reference current source circuit 21 and diode-connected NMOS transistor N25 constitute a constant voltage generation circuit 22.

A start-up circuit 23 is coupled to the output node BIASP of the reference current source circuit 21. An inverter with PMOS transistor P24 and NMOS transistor N24 in the start-up circuit 23 is driven by the internal power supply voltage LVdd which rises-up behind power-on. Therefore, this inverter's output drives to turn on NMOS transistor N23 at the beginning of power-on, whereby the node BIASP is initially set at a low level.

The constant voltage generation circuit 22 outputs a constant voltage defined by crossing of a load curve of PMOS transistor P23 driven by BIASP and an I-V curve of NMOS transistor N25. PMOS transistor P22 used in the reference current source circuit 21 and PMOS transistor P23 used in the constant voltage generation circuit 22 constitute a current-mirror circuit. Therefore, the output voltage of the constant voltage generation circuit 22 serves as the reference voltage IREFN that is constant without regard to variations of the power supply voltage. This output voltage IREFN is commonly supplied to the delay circuit 11a and 11b.

Next, referring to the timing chart shown in FIG. 4, an operation of the filter circuit 10 will be explained in detail below. Shown in FIG. 4 are waveforms at the respective portions in the filter circuit 10 in case logic signals at the input node IN are ones which sequentially change to be "L", "H", "L" and "H". For example, "L" and "H" levels correspond to logic "0" and "1" data, respectively.

In this embodiment as described above, applying a certain delay to a falling edge of the "H" level at each node MONa, MONb by use of delay circuits with the first stages of inverters I3a, I3b and capacitors Ca, Cb coupled to the node MONa, MONb, respectively, glitches contained in the input logic signals are eliminated. For the purpose of this, two systems of delay circuits, that is, first delay circuit 11a which performs delay process for the "rising edge" from "L" to "H" at the input node IN and glitch-elimination, and second delay circuit 11b which performs delay process for the "falling edge" from "H" to "L" at the input node IN and glitch-elimination, are disposed in parallel.

FIG. 4 shows that the internal power supply voltage LVdd rises with a delay time T behind the power supply voltage Vcc at a power-on time. During this delay time T, PMOS transistors P6a and P6b become on in the delay circuits 11a and 11b. Additionally, one of NMOS transistors N8a and N8b becomes on in response to the voltage levels of the nodes ACT0 and ACT1. Therefore, the initial setup circuits 5a and 5b initially set the nodes AOUT1a and AOUT1b at "L" and "H", or "H" and "L", respectively.

In the example shown in FIG. 4, while the input node IN is set at "L" previous to timing t0, node ACT0 and ACT1 are "H" and "L", respectively. In response to this, the nodes AOUT1a and AOUT1b in the delay circuits 11a and 11b become "L" and "H", respectively. Further, the output node OUT is set at an "L" level in response to the "1" level of the input node IN.

The input node IN changing in level from "L" into "H" at timing t0, in response to this, the output node ACTa of NAND gate 2a becomes "L", thereby activating the differential amplifier 3a in the first delay circuit 11a. Further, in response to ACT1="H", the output node MONa of the inverter I3a changes in level from "H" into "L". The falling waveform "A" of the node MONa is made gentle due to the discharge current limitation of the inverter I3a and capacitor Ca. The output AOUT0a of the differential amplifier 3a becomes "L" with a certain delay time based on the gentle level change as described above.

The outputs AOUT0a and OUTa becoming "L", the differential amplifier 3a becomes inactive. Even if the differential amplifier 3a becomes inactive, the "L" level of the output AOUT0a is held as it is, because NMOS transistors N6a and N7a are driven by ACT1="H" and AOUT1a="H" to become on.

In response to the output AOUT0a="L" of the differential amplifier 3a, PMOS transistor P11 of the output driver 12 becomes on. All the while, the output ACTb of the NAND gate 2b is kept at "H" in the second delay circuit 11b, whereby the differential amplifier 3b is held inactive. Further, since NMOS transistor N8b is on in response to the "H" level of node ACT1, the output OUTb is set at "H" at an early timing after the level transition of the input node IN at timing t0.

Therefore, the filter output node OUT becomes "H" in response to the "L" level transition of the node OUTa of the first delay circuit 11a. In other words, the filter output node OUT rises up in voltage level with a constant delay late in timing t0. Simultaneously, output ACTa of NAND gate 2a becomes "H" in response to the "L" level of output OUTa, hereinafter the differential amplifier 3a becomes inactive.

As described above, the signal level at the input node IN rising up, the first delay circuit 11a becomes active such that glitch noises are eliminated or suppressed by the inverter I3a and capacitor Ca. And, at the output node OUT, an "H" level output may be obtained, which rises-up with a constant delay behind the rising edge timing of the input node IN. During the input node IN is held at "H", the second delay circuit 11b is kept inactive.

Then, the input node IN changing from "H" into "L" at timing t1, the differential amplifier 3b is activated in the second delay circuit 11b. At this time, the output node MONb of the inverter I3b changes in level from "H" into "L". The falling waveform "B" of the node MONb is made gentle as defined by the current source transistor N2b and capacitor Cb.

And, the output OUTb becoming "L" with a constant delay as similar to the above-described operation in the first delay circuit 11a, thereby causing the differential amplifier 3b to be inactive, and letting the filter output node OUT be "L". That is, the signal level at the input node IN falling, the second delay circuit 3b becomes active such that glitch noises are eliminated or suppressed by the inverter I3b and capacitor Cb.

As stated above, the filer circuit 10 in accordance with the embodiment has two systems of delay circuits 11a and 11b, only one of which becomes to be operable in response to the respective level transitions of input logic signals. In detail, differential amplifiers 3a and 3b are activated in accordance with level transitions at the input node IN until when output voltage levels at the output nodes OUTa and OUTb of the delay circuit 11a and 11b are determined, respectively, and held inactive unless the above-described activation times. Therefore, through-current of the differential amplifiers 3a and 3b may be limited to be necessary and minimum, resulting in achieving a filter circuit without wasteful power consumption.

In addition, glitch elimination is done in the inverters I3a and I3b, which receive the level transitions of the input node IN, by use of falling delays at when outputs MONa and MONb thereof change from "H" into "L" with a large discharge time constant. These discharge operations of the outputs MONa and MONb are defined by constant currents of the current source NMOS transistors N2a and N2b driven by the reference voltage IREFN which is not dependent of the power supply voltage. The reference voltage IREFN is also applied to the current-mirror differential amplifiers 3a and 3b, which is used for detecting the level transitions of outputs MONa and MONb. Further, the current source transistors N2a and N2b in the inverters I3a and I3b, and main portion transistors in the differential amplifiers 3a and 3b are formed of I-type transistors with little threshold variation. Due to the above-described reasons, the filer circuit 10 in accordance with this embodiment may have advantageous properties. That is, the filter circuit 10 is hardly dependent on the power supply voltage and free from the transistor threshold variation in contrast to the conventional filter circuit with a combination of inverter chain and integral circuit.

In the above-described embodiment, the reference voltage generation circuit 20 shown in FIG. 2 is commonly used for the delay circuits 3a and 3b and always supplying the reference voltage IREFN to them. In contrast to this, it is possible to selectively supply reference voltages to the differential amplifiers 3a and 3b as being simultaneously with activation thereof. For the purpose of this, there are provided, for example, reference voltage generation circuits 20a and 20b shown in FIGS. 3A and 3B, which are adapted to the differential amplifiers 3a and 3b, respectively.

These reference voltage generation circuits 20a and 20b have load circuits formed of I-type of PMOS transistors P31a and P31b, and I-type of diode-connected NMOS transistors N31a and N31b, respectively. Coupled to output nodes thereof are reset-use NMOS transistors N32a and N32b.

Figure 3A:
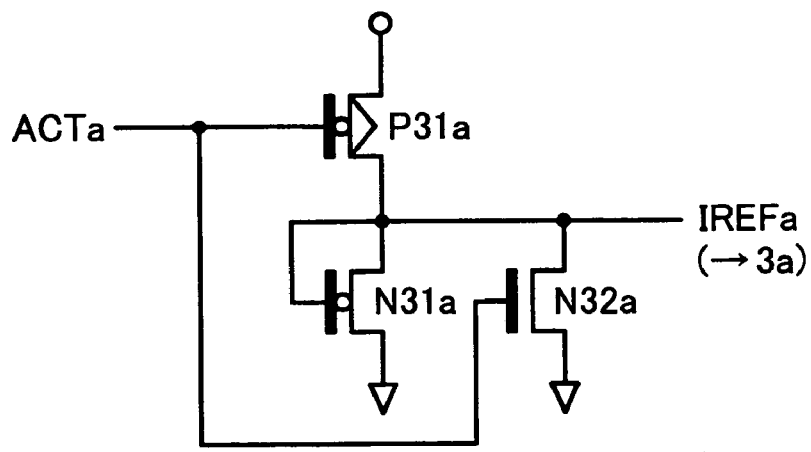
FIGS. 3A and 3B show reference voltage generation circuits used in the respective differential amplifiers in a filer circuit in accordance with another embodiment.
Figure 3B:
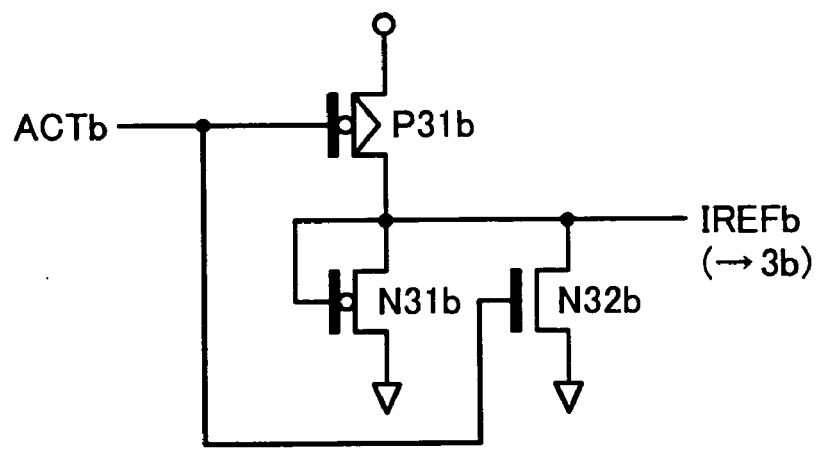
Figure 5:
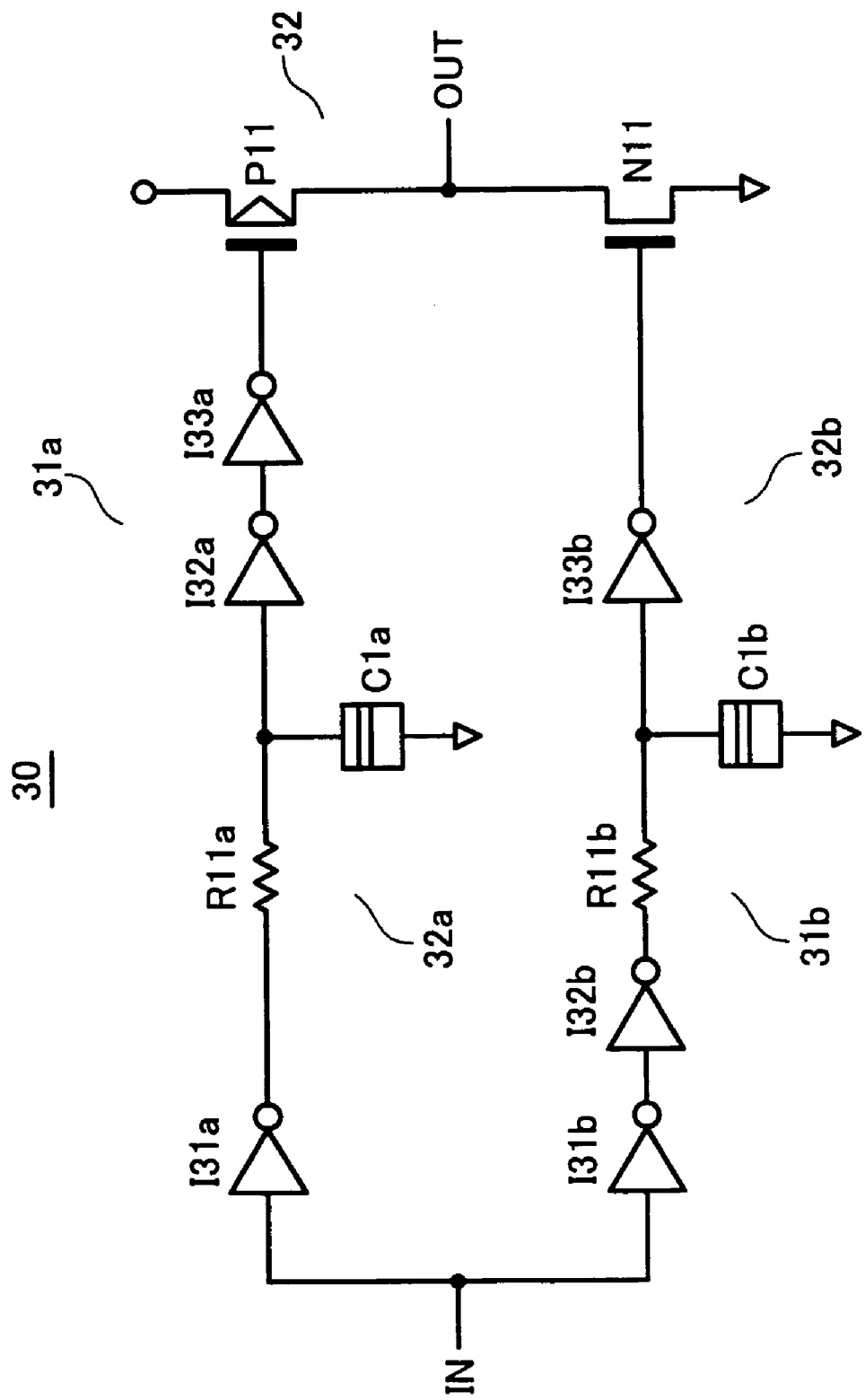
FIG. 5 shows a conventional filter circuit.

The reference voltage generation circuit 20a shown in FIG. 3A outputs a reference voltage IREFa while PMOS transistor P31a is on during the node ACTa is in an "L" state. That is, this reference voltage generation circuit 20a is activated only while the differential amplifier 3a is activated in the delay circuit 11a, thereby supplying the reference voltage IREFa to the differential amplifier 3a. The reference voltage generation circuit 20b shown in FIG. 3B outputs a reference voltage IREFb while PMOS transistor P31b is on during the node ACTb is in an "L" state. That is, this reference voltage generation circuit 20b is activated only while the differential amplifier 3b is activated in the delay circuit 11b, thereby supplying the reference voltage IREFb to the differential amplifier 3b. While these reference voltage generation circuits 20a and 20b are inactive, the reset-use transistors N32a and N32b becomes on, thereby setting the output nodes to be "L", respectively.

Using the above-described reference voltage generation circuits 20a and 20b, it is possible to reduce the power consumption more effectively, due to that no through-current is carried by these circuits in stand-by states.

[Embodiment 2]

Figure 6:
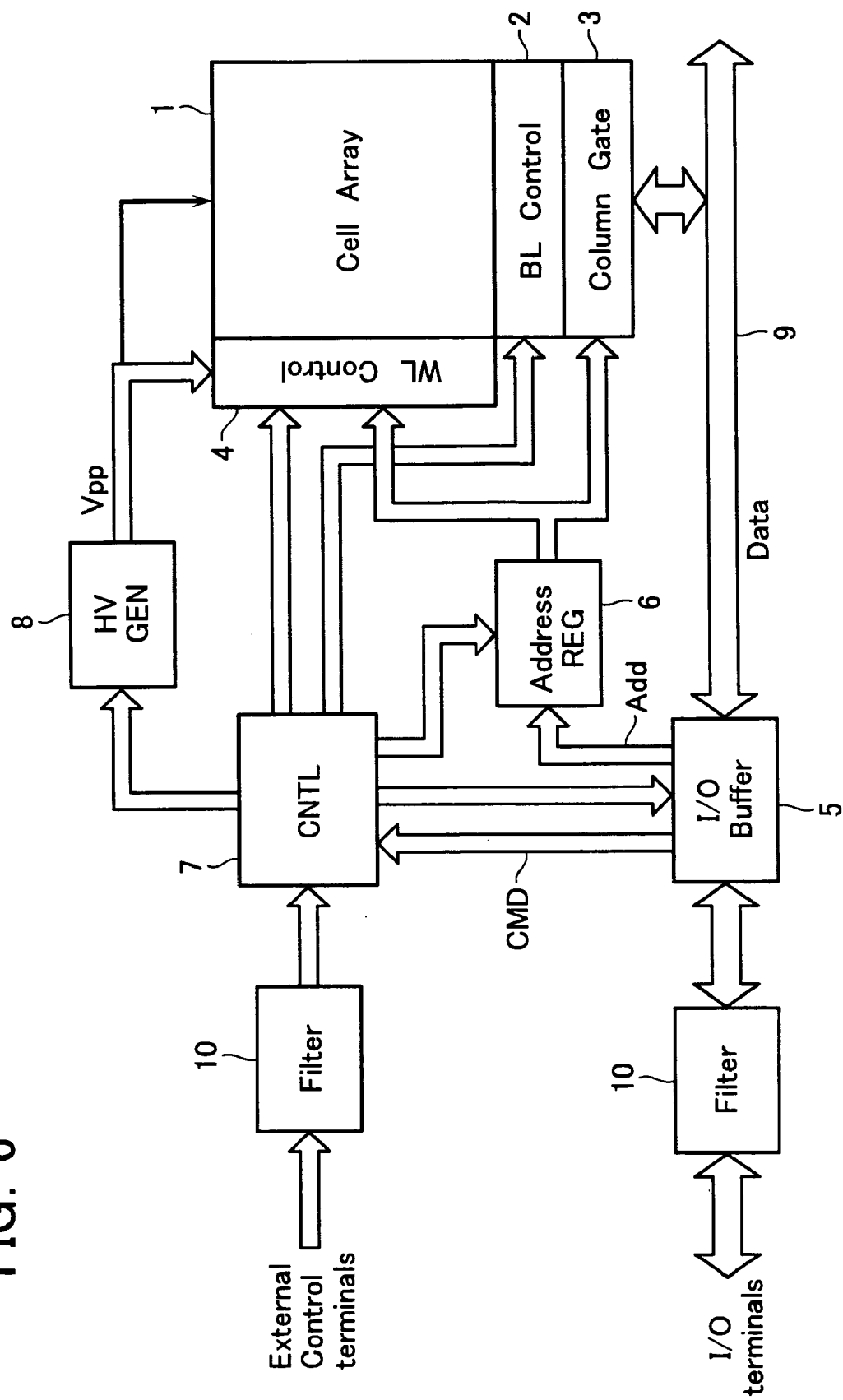
FIG. 6 shows a block configuration of a NAND-type flash memory device in which the filter circuit is installed.
Figure 7:
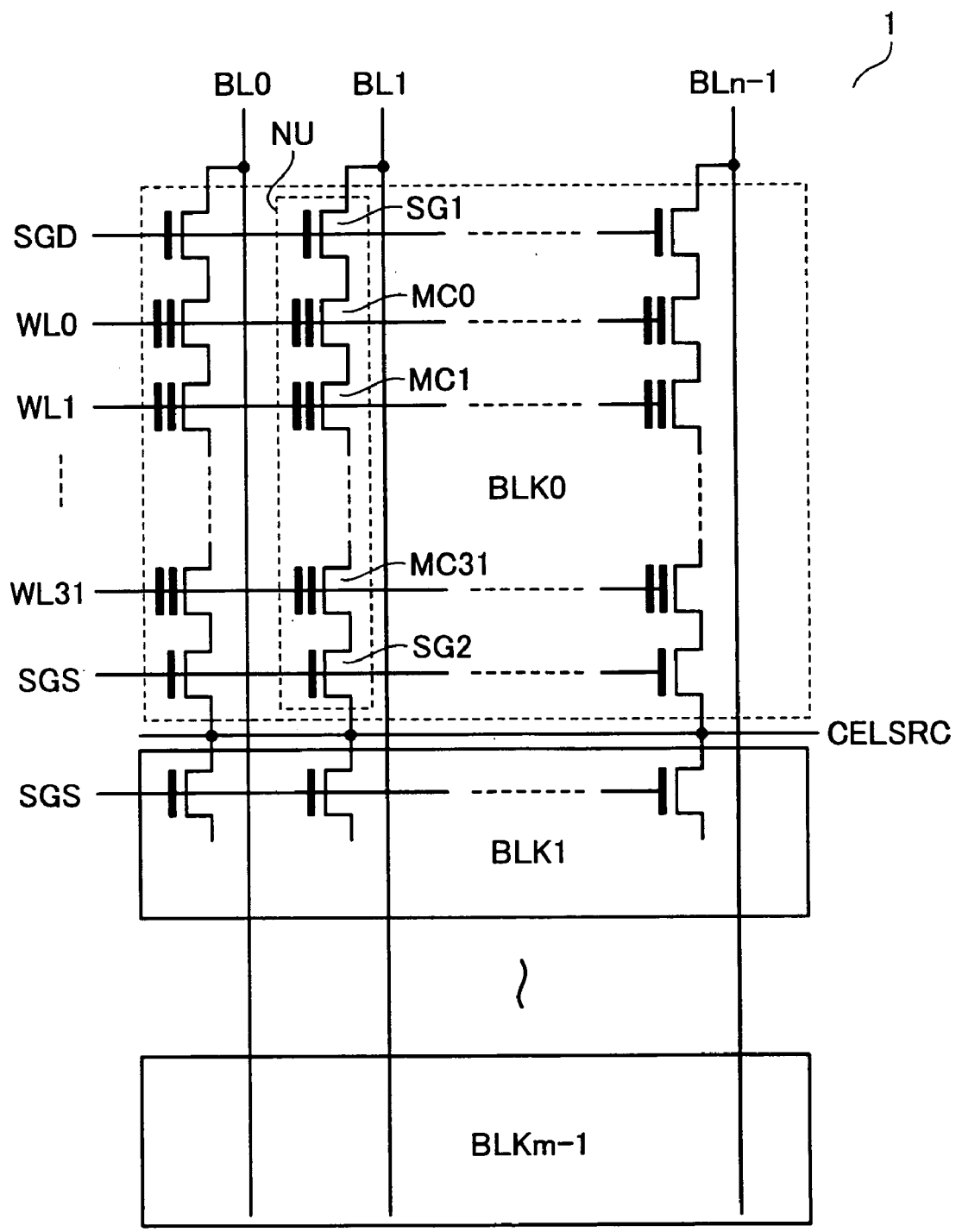
FIG. 7 shows an arrangement of the cell array in the memory device.

FIG. 6 shows a block configuration of a NAND-type flash memory device, which is an example of the above-described semiconductor integrated circuit device, and FIG. 7 shows an arrangement of the cell array 1. The cell array 1 is, as shown in FIG. 7, formed of NAND cell units NU arranged in a matrix manner. Each NAND cell unit NU has a plurality of memory cells (i.e., thirty two cells in this case) MC0–MC31 connected in series and select gate transistors SG1 and SG2, which couple the respective ends of the memory cell string to bit line BL and common source line CELSRC.

Each memory cell MCi is a stacked gate MOS transistor with a floating gate serving as a charge storage layer, and stores a bit data in a non-volatile manner that is defined by a threshold voltage determined by a charge storage state of the floating gate as data. The cell data is electrically rewritable by electron injection operation into the floating gate and electron releasing operation therefrom.

Control gates of the memory cells MCi in the NAND cell unit NU are connected to different word lines WLi. Gates of the select gate transistors SG1 and SG2 are connected to select gate lines SGD and SGS, respectively, which are disposed in parallel with the word lines WL.

One page defined as a group of memory cells arranged along a word line serves as a unit of data read and write. One block, which is defined as a group of NAND cell units with a shared word line, serves as a unit of data erasure. Usually, as shown in FIG. 7, a plurality of blocks BLKj(j=0, 1, . . . ) are arranged in the direction of the bit line BL.

A word line control circuit 4, which includes row decoder and word line driver, is disposed for selectively driving a word line in the cell array 1. A bit line control circuit 2 connected to bit lines of the cell array 1 has sense amplifier circuits with data latches, and serves as a page buffer for sensing read data of one page and storing write data of one page.

Disposed between the bit line control circuit 2 and a data bus 9 is a column gate circuit 3 which is controlled by column address. Under the control of the column gate circuit 3, one page data read in the bit line control circuit 2 are serially output, for example, by a byte to I/O terminals via the data bus 9. Similarly, write data are serially transferred on the data bus 9 to be loaded into the bit line control circuit 2.

Address "Add" and command "CMD" supplied from the I/O terminals are transferred to address register 6 and internal controller 7, respectively. Row and column addresses are transferred to the word line control circuit 4 and column gate circuit 3, respectively, via the address register 6. The controller 7 receives external control signals such as write enable signal, read enable signal, address latch enable signal and the like supplied from external control terminals to execute sequential controls of write and erase operations, and a control of a read operation on instructions of the respective command data. A high voltage generation circuit 8 is disposed to output various boosted voltages, which are used in write, read and erase modes, respectively.

Disposed between the I/O terminals and the I/O buffer 5, and between the external control terminals and the controller 7 are filer circuits 10, which are formed as described in the Embodiment 1 to eliminate glitch noises contained in logic signals supplied from the external terminals, thereby supplying noiseless signals to the respective internal circuits.

[Embodiment 3]

As an embodiment, an electric card using the non-volatile semiconductor memory devices according to the above-described Embodiment 2 of the present invention and an electric device using the card will be described bellow.

Figure 8:
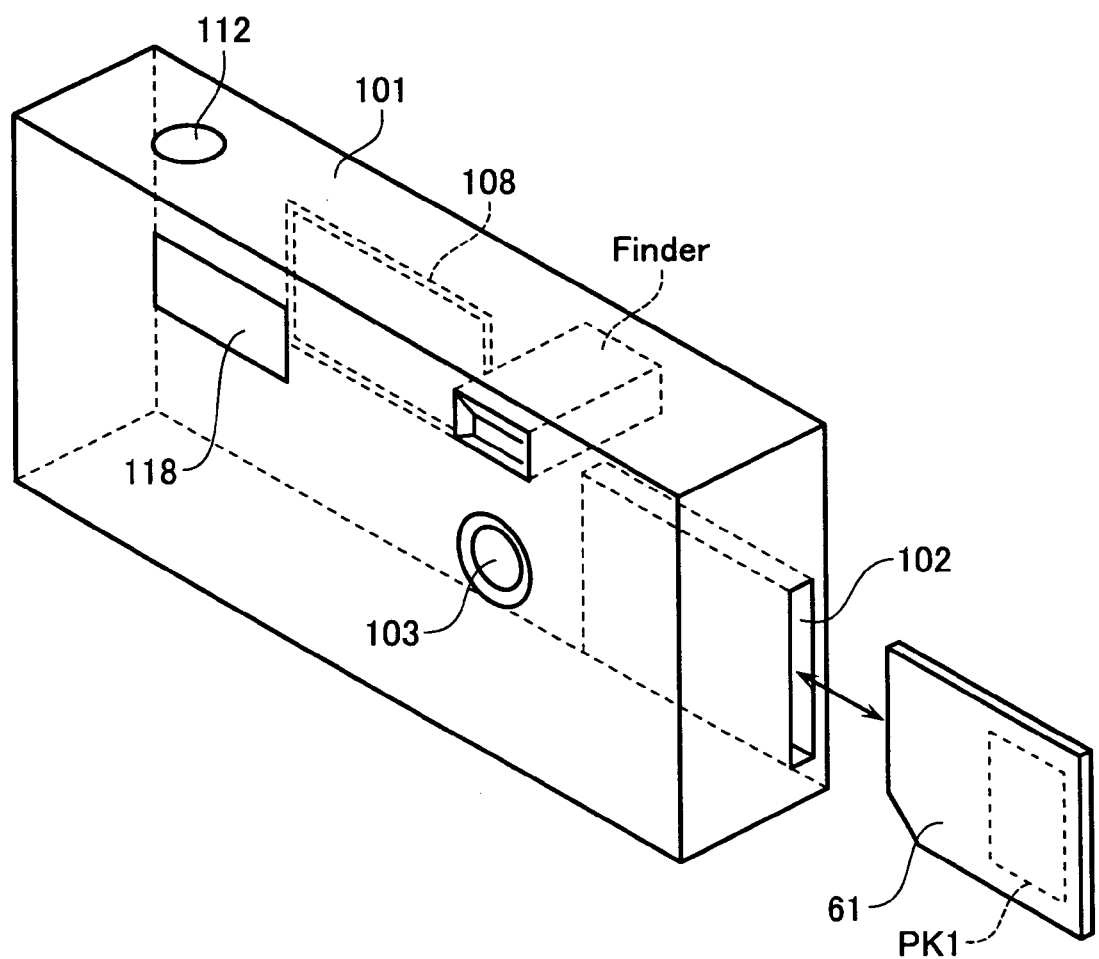
FIG. 8 shows another embodiment applied to a digital still camera.

FIG. 8 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiment is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 9:
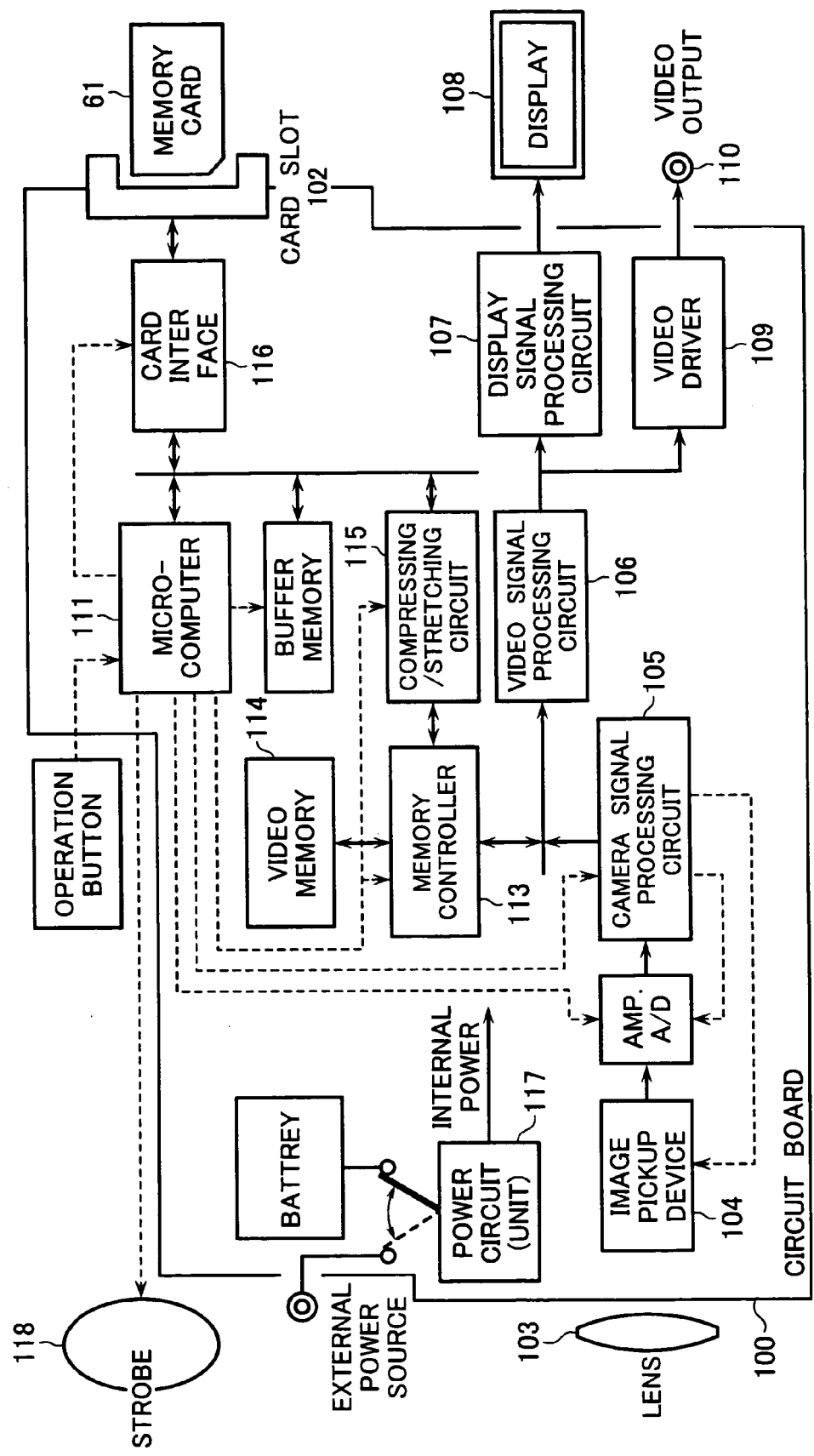
FIG. 9 shows the internal configuration of the digital still camera.
Figure 10A:
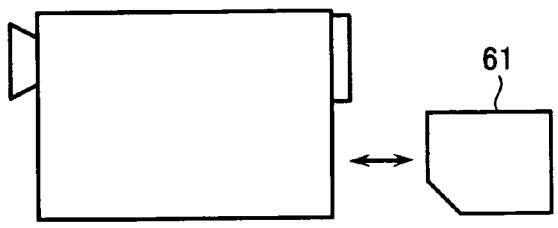
FIGS. 10A to 10J show other electric devices to which the embodiment is applied.
Figure 10B:
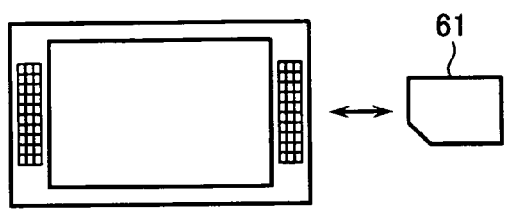
Figure 10C:
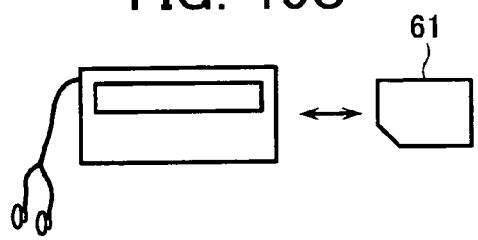
Figure 10D:
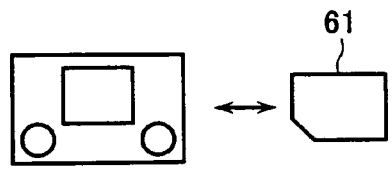
Figure 10E:
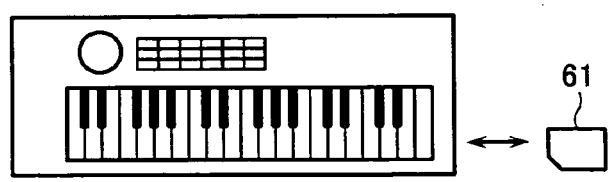
Figure 10F:
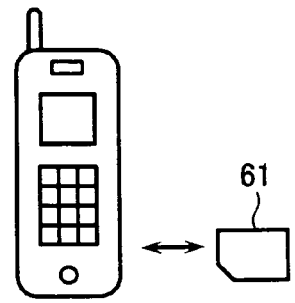
Figure 10G:
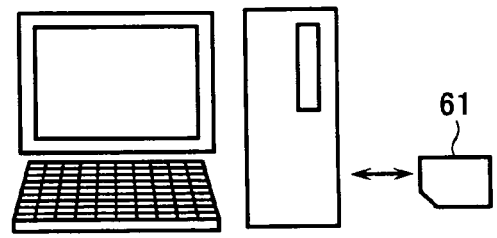
Figure 10H:
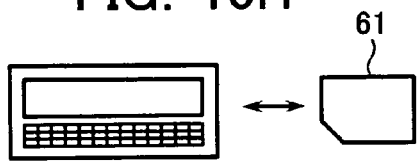
Figure 10I:
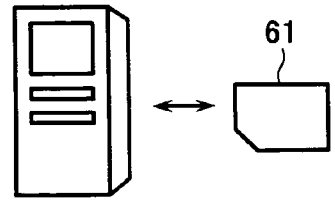
Figure 10J:
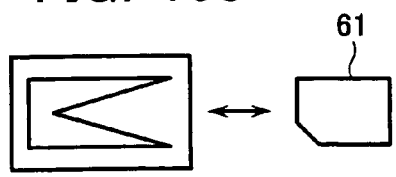

FIG. 9 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 10A to 10J, as well as in portable electric devices. That is, the electric card can also be used in a video camera shown in FIG. 10A, a television set shown in FIG. 10B, an audio apparatus shown in FIG. 10C, a game apparatus shown in FIG. 10D, an electric musical instrument shown in FIG. 10E, a cell phone shown in FIG. 10F, a personal computer shown in FIG. 10G, a personal digital assistant (PDA) shown in FIG. 10H, a voice recorder shown in FIG. 10I, and a PC card shown in FIG. 10J.

This invention is not limited to the above-described embodiments. For example, this invention may be applied to other non-volatile semiconductor memory devices such as NOR-type, DINOR-type and the like flash memories. Further, it will be understood by those skilled in the art that various changes in form and detail may be made without departing from the spirit, scope, and teaching of the invention.

What is claimed is:

1. A semiconductor integrated circuit device with a filter circuit serving for eliminating a glitch contained in a logic signal supplied to the device, wherein said filter circuit comprises:

a first delay circuit activated within a certain period after each rising edge timing of input logic signals to delay the rising edge;

a second delay circuit activated within a certain period after each falling edge timing of said input logic signals to delay the falling edge; and an output driver controlled by outputs of said first and second delay circuits to output delayed logic signals to an output node in response to said input logic signals, wherein said first and second delay circuits each comprise a current-mirror differential amplifier configured to be activated within a certain period after each rising edge timing of one of two species of signals with complementary levels generated based on said input logic signal, a first inverter to which one of said two species of signals with complementary levels generated based on said input logic signals are input, said first inverter having a current source transistor driven by a reference voltage to limit output discharge current of said first inverter, and a capacitor coupled to an output of said first inverter, wherein said current-mirror differential amplifier is configured to be activated within a certain period after each rising edge timing of said one of two species of signals for detecting an output voltage of said first inverter in comparison with said reference voltage.

2. The semiconductor integrated circuit device according to claim 1, wherein said differential amplifier comprises:

a pair of driver NMOS transistors, one gate of which is connected to the output of said first inverter and the other gate is driven by said reference voltage;

a pair of load PMOS transistors constituting a current-mirror circuit, drains of which are coupled to drains of said driver NMOS transistors, respectively;

an activating NMOS transistor disposed between a common source of said driver NMOS transistors and a ground potential node; and an activating PNOS transistor disposed between a common source of said load PMOS transistors and a power supply node.

3. The semiconductor integrated circuit device according to claim 1, wherein said first and second delay circuits further comprise logic gates for activating said differential amplifier until outputting corresponding delayed signals from the respective rising edge timings of said two species of signals.

4. The semiconductor integrated circuit device according to claim 1, wherein said first and second delay circuits each further comprise:

second and third inverters disposed in series between the output of said differential amplifier and said output driver;

a latch circuit configured to hold the output level of said differential amplifier after having disabled; and an initial setup circuit configured to initially set the voltage level of an interconnection node between said second and third inverters at a power-on time.

5. The semiconductor integrated circuit device according to claim 4, wherein said latch circuit is composed of said second inverter and a fourth inverter connected in parallel with said second inverter with a reversed polarity, said fourth inverter being driven by one of said two species of signals.

6. The semiconductor integrated circuit device according to claim 4, wherein said initial setup circuit comprises:

a PMOS transistor for charging-up the interconnection node within a certain period after power-on, which is off-driven by an internal power supply voltage rising-up behind power-on; and an NMOS transistor for discharging the interconnection node, which is on-driven by one of said two species of signals.

7. The semiconductor integrated circuit device according to claim 1, wherein said output driver comprises:

a PMOS transistor, source and drain of which are coupled to a power supply node and said output node, respectively, gate thereof being driven by output of said first delay circuit;

an NMOS transistor, source and drain of which are coupled to a ground potential node and said output node, respectively, gate thereof being driven by output of said second delay circuit; and a feed-back circuit connected to said output node to do positive feed-back control of the voltage level of said output node.

8. The semiconductor integrated circuit device according to claim 1, further comprising:

a reference voltage generation circuit configured to be commonly used for said first and second delay circuits for supplying the reference voltage, which is independent of power supply voltage variation, to said current source transistor in said first inverter, and to said differential amplifier.

9. The semiconductor integrated circuit device according to claim 1, further comprising:

first and second reference voltage generation circuits each configured to generate a reference voltage supplied to said deferential amplifier in each of said first and second delay circuits, said first and second reference voltage generation circuits each being activated simultaneously with activation of said differential amplifier in each of said first and second delay circuits.

10. The semiconductor integrated circuit device according to claim 1, wherein the semiconductor integrated circuit device is a non-volatile memory device.

11. The semiconductor integrated circuit device according to claim 10, wherein the non-volatile memory device is a NAND flash memory.

12. An electric card equipped with a non-volatile memory device defined in claim 10.

13. An electric device comprising:

a card interface;

a card slot connected to said card interface; and an electric card defined in claim 12 and electrically connectable to said card slot.

* * * * *